United States Patent
Li et al.

(10) Patent No.: US 10,690,604 B2
(45) Date of Patent: Jun. 23, 2020

(54) SENSORS AND METHODS OF IDENTIFYING A GAS, AND LEVITATED SPIN-OPTOMECHANICAL SYSTEMS

(71) Applicant: PURDUE RESEARCH FOUNDATION, West Lafayette, IN (US)

(72) Inventors: Tongcang Li, West Lafayette, IN (US); Thai Hoang, Lafayette, IN (US); Jonghoon Ahn, West Lafayette, IN (US); Jaehoon Bang, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 155 days.

(21) Appl. No.: 15/681,756

(22) Filed: Aug. 21, 2017

(65) Prior Publication Data
US 2018/0059039 A1    Mar. 1, 2018

Related U.S. Application Data

(60) Provisional application No. 62/379,435, filed on Aug. 25, 2016, provisional application No. 62/381,060, filed on Aug. 30, 2016.

(51) Int. Cl.
*G01N 24/00* (2006.01)
*G01N 24/10* (2006.01)
*G01R 33/26* (2006.01)

(52) U.S. Cl.
CPC .......... *G01N 24/006* (2013.01); *G01N 24/10* (2013.01); *G01R 33/26* (2013.01)

(58) Field of Classification Search
CPC ...... G01N 24/006; G01N 24/10; G01R 33/26; G01R 33/60; G01R 33/24
(Continued)

(56) References Cited

U.S. PATENT DOCUMENTS

| 3,860,818 A | * | 1/1975 | Stalder | G01N 21/85 250/343 |
| 2004/0221795 A1 | * | 11/2004 | Scarsbrook | C30B 25/105 117/68 |

(Continued)

OTHER PUBLICATIONS

Horowitz et al., Electron spin resonance of nitrogen vacancy centers in optically trapped nanodiamonds, file:///C:/Users/dpretlow/Documents/e-Red%20Folder/15681756/Electron%20spin%20resonance%20of%20nitrogen-vac...pdf (Year: 2012).*
(Continued)

*Primary Examiner* — Patrick Assouad
*Assistant Examiner* — Demetrius R Pretlow
(74) *Attorney, Agent, or Firm* — Hartman Global IP Law; Gary M. Hartman; Domenica N. S. Hartman

(57) ABSTRACT

Sensors and methods are provided that include a diamond material containing a nitrogen vacancy center, the diamond material being configured to be exposed to an environment comprising one or more gases, an optical light source configured to excite the nitrogen vacancy center of the diamond material with an optical light beam produced therefrom, a detector configured to detect a signal originating from the diamond material in response to the optical light beam exciting the nitrogen vacancy center, and the capability of analyzing the signal to identify a specific gas in the environment. Also included are levitated spin-optomechanical systems capable of elevating in a vacuum a diamond material containing a nitrogen vacancy center, applying microwave radiation to the diamond material for controlling and flipping the electron spin of the nitrogen vacancy center, and monitoring electron spin of the nitrogen vacancy center.

16 Claims, 20 Drawing Sheets

(58) Field of Classification Search
USPC .......................................................... 324/305
See application file for complete search history.

(56) References Cited

U.S. PATENT DOCUMENTS

| | | | | |
|---|---|---|---|---|
| 2010/0133111 A1* | 6/2010 | Nocera | ................... | C25B 1/003 |
| | | | | 205/633 |
| 2010/0308813 A1* | 12/2010 | Lukin | ................... | G01R 33/032 |
| | | | | 324/244.1 |
| 2014/0340085 A1* | 11/2014 | Cappellaro | ........ | G01R 33/1284 |
| | | | | 324/316 |

OTHER PUBLICATIONS

Pham, Magnetic Field Sensing in Nitrogen-Vacancy Color Centers in Diamond, http://walsworth.physics.harvard.edu/publications/2013_Pham_HUPhDThesis.pdf (Year: 2013).*

Johnston, Levitating diamonds could improve motion sensors, Sep. 2015 (Year: 2015).*

University of Rochester, Researchers use laser to levitate glowing nanodiamonds in vacuum, https://www.rochester.edu/newscenter/researchers-use-laser-to-levitate-glowing-nanodiamonds-in-vacuum/ (Year: 2015).*

Frangeskou et al., Optical levitation of high purity nanodiamonds in vacuum without heating, https://arxiv.org/pdf/1608.04724.pdf (Year: 2016).*

Levi P. Neukirch, Eva Von Haartman, Jessica M. Rosenholm and A. Nick Vamivakas; "Multi-dimenisonal single-spin nano-optomechanics with a levitated nanodiamond"; Nature Photonics; Sep. 7, 2015.

* cited by examiner

SENSORS AND METHODS OF IDENTIFYING A GAS, AND LEVITATED SPIN-OPTOMECHANICAL SYSTEMS

CROSS REFERENCE TO RELATED APPLICATIONS

This application claims the benefit of U.S. Provisional Application Nos. 62/379,435, filed Aug. 25, 2016, and 62/381,060, filed Aug. 30, 2016. The contents of both of these applications are incorporated herein by reference.

STATEMENT REGARDING FEDERALLY SPONSORED RESEARCH

This invention was made with government support under Award No. 1555035 awarded by the National Science Foundation (NSF) Division of Physics (PHY). The government has certain rights in the invention.

BACKGROUND OF THE INVENTION

The present invention generally relates to methods and systems for acquiring physical and quantum information, and sensors configured to acquire physical and quantum information to detect and/or measure gases.

Gas sensing is utilized in many fields. As a nonlimiting example, oxygen gas sensing is used to measure the exhaust gas concentration of oxygen for internal combustion engines in automobiles and other vehicles to improve the vehicle efficiency and reduce air pollution. A common type of oxygen gas sensor utilizes zirconia ($ZrO_2$) and relies on chemical reactions that occur between oxygen and fuel. Drawbacks of zirconia oxygen sensors include their relatively large size, consumption of oxygen, and necessity to be maintained at high temperature in order to function properly.

Another known type of oxygen sensor operates on the basis of dynamic fluorescence quenching of fluorescent dye molecules. Drawbacks of gas sensors that utilize fluorescent dye molecules include relatively short lives and a relatively narrow range of operating temperature.

In view of the above, it can be appreciated that there is an ongoing desire for gas sensing systems and methods capable of at least partly overcoming or avoiding the problems, shortcomings or disadvantages noted above, nonlimiting examples of which include sensor size, consumption of detected gas, life spans, and operating temperatures.

BRIEF DESCRIPTION OF THE INVENTION

The present invention provides methods and systems suitable for acquiring physical and quantum information that can be utilized for a wide variety of commercial and research applications, including systems, methods, and sensors for detecting and/or measuring a gas.

According to one aspect of the invention, a sensor is provided that includes a diamond material containing a nitrogen vacancy center, the diamond material being configured to be exposed to an environment comprising one or more gases, an optical light source configured to excite the nitrogen vacancy center of the diamond material with an optical light beam produced therefrom, a detector configured to detect a signal originating from the diamond material in response to the optical light beam exciting the nitrogen vacancy center, and the capability of analyzing the signal to identify a specific gas in the environment.

According to another aspect of the invention, a method is provided that includes exposing a diamond material containing a nitrogen vacancy center to an environment comprising one or more gases, exciting the nitrogen vacancy center of the diamond material with an optical light beam, detecting a signal originating from the diamond material in response to excitation of the nitrogen vacancy center, and analyzing the signal to identify a specific gas in the environment.

According to another aspect of the invention, a levitated spin-optomechanical system is provided that includes a laser source configured for elevating in a vacuum a diamond material containing a nitrogen vacancy center, a microwave source configured to apply microwave radiation to the diamond material for controlling and flipping the electron spin of the nitrogen vacancy center, and a detector for monitoring electron spin of the nitrogen vacancy center.

Other aspects of the invention include a method of using the levitated spin-optomechanical system described above.

Technical effects of the sensors and methods preferably include the capability of using diamond nitrogen-vacancy centers to identify a specific gas in an environment. The active component utilized by this technology may be as small as a few nanometers, may have a wide range of operating temperatures, are preferably capable of exhibiting long operational lives, and do not require the consumption of gases. Technical effects of the levitated spin-optomechanical system described above preferably include the capability of using diamond nitrogen-vacancy centers to acquire physical and quantum information, nonlimiting examples of which include applications in sensors, quantum information processing, and studies into the fundamental physics of quantum mechanics.

Other aspects and advantages of this invention will be further appreciated from the following detailed description.

BRIEF DESCRIPTION OF THE DRAWINGS

In FIG. 4, the fluorescence strength is shown to increase by about 2.5 times when the power of the trapping laser is reduced from 500 to 60 mW ("a.u." stands for "arbitrary unit"). The zero phonon line (ZPL) is indicated by an arrow. The nanodiamond is excited with a 260 μW green laser. FIG. 5 plots electron spin resonance (ESR) spectra of NV centers at different trapping powers. Normalized $I_{PL}$ is the ratio of the total fluorescence count with and without microwave excitation. The ESR spectra data are taken with a green laser of 30 µW and fitted with the double Gaussian function. Each ESR scan took about thirty minutes to achieve a high signal-to-noise ratio. The ESR spectra were taken with the nanodiamond marked as circles in FIG. 6, which has a small temperature change. FIG. 6 evidences that at the initial trapping power of 500 mW, the internal temperatures of the nanodiamonds ranged between 300K and 400K depending on individual nanodiamonds. When the trapping power was reduced, the internal temperatures of the nanodiamonds approached room temperature (296K). Temperatures were extracted from the double Gaussian fits of the ESR spectra, and the error bars of temperatures were obtained from the standard errors of the fitted parameters from the ESR spectra. Each marker shape represents a different nanodiamond. Data were acquired at atmospheric pressure.

FIG. 7 plots ESR spectra of a levitated nanodiamond at different air pressures. Each ESR scan took about thirty minutes to achieve a high signal-to-noise ratio. The peaks of the ESR spectra shifted in vacuum due to the thermal effect. The ESR spectra data were fitted with double Gaussian functions. FIG. 8 plots the measured temperature of two different nanodiamonds as a function of air pressure. From atmospheric pressure to low vacuum, their temperatures changed from 300 K to 450 K and beyond. The error bar of temperature measurement is smaller than the marker size. Each marker shape represents a different nanodiamond. FIG. 9 evidences that the maximum contrast of each ESR spectrum increased as air pressure decreased. Arrows of the lines indicate the time order of the experiment. The trapping power for each nanodiamond was always held constant. The error bars of temperature measurements and ESR contrast were obtained from the standard errors of the fitted parameters of the ESR spectra.

FIG. 10 plots the measured temperature of a nanodiamond as a function of the oxygen or helium pressure. From 750 torr to low vacuum, the temperature of the nanodiamond changed from 300 K to 380 K and beyond. Circle markers represent the data sets (no. 1 and no. 3), which were taken in oxygen, and square markers represent the data set (no. 2), which was taken in helium (concentration greater than 99 percent). FIG. 11 evidences that the ESR contrast increased as the gas pressure decreased. The ESR contrast in helium was higher than the one in oxygen. FIG. 12 plots the total fluorescence count as a function of pressure. The fluorescence signal in helium was lower than the one in oxygen. FIG. 13 plots the count difference between oxygen and helium as a function of pressure. The dashed line represents the linear fit of the data. The powers of the 1550 nm trapping laser and the 532 nm excitation laser were always held constant with a peak intensity of about 200 µW/µm². The error bars of temperature measurements and ESR contrasts in FIGS. 10 and 11 were obtained from the standard errors of the fitted parameters from the ESR spectra data. The error bars of photon counts in FIGS. 12 and 13 were the standard deviations of about seventy measurements of total fluorescence signal from the nanodiamond. Each measurement took about 5.3 s.

FIG. 15 plots typical fluorescence spectra at atmospheric pressure (759 torr) and in low vacuum (31 torr). The nanodiamond was excited with a 30 µW green laser. The zero phonon line of the NV is visible near 640 nm ("a.u." stands for "arbitrary unit"). FIG. 16 plots the power spectral density of the center-of-mass motion of the nanodiamond trapped at two different pressures: atmospheric (759 torr) and low vacuum (31 torr). A resonant peak appears in the plot obtained at low vacuum. The solid curves are theoretical fits (equation (1)). FIG. 17 plots the hydrodynamic diameter of a trapped nanodiamond calculated from the measured viscosity damping $\Gamma_0$ (equation (2)). FIG. 18 is a plot of the viscous damping factor $\Gamma_0$ and total fluorescence count of a levitated nanodiamond at 31 torr. The nanodiamond is lost at the right side of this figure. $\Gamma_0$ is fairly constant, suggesting there was no change in the particle size before its loss. FIG. 19 is a plot of the total fluorescence count of the optically trapped nanodiamond when the chamber was pumped to vacuum. The nanodiamond was lost at about 9 torr.

DETAILED DESCRIPTION OF THE INVENTION

This disclosure provides methods and systems for acquiring physical and quantum information, and sensors configured to employ such a method or system to detect and/or measure gases, a nonlimiting example of which is oxygen. The systems include one or more nanodiamonds having nitrogen-vacancy (NV) centers, and rely on the principle that different gases, such as oxygen and helium, have different effects on nanodiamond NV centers, including for example both the photoluminescence and electron spin resonance (ESR) thereof. As such, a system may detect and/or measure a gas in an environment exposed to the system by detecting its effect on nanodiamond NV centers. Optionally, the effect could be compared to an effect of nanodiamond NV centers by a reference gas, for example, to compensate for temperature, pressure, or other factors. The system could also include temperature sensors, pressure sensors, or other types of sensors to compensate for such factors, if necessary. As used herein, the term nanodiamonds will refer to diamonds with a maximum dimension of less than one micrometer (nanoparticle). A NV center refers to an atomic-scale defect in the crystal lattice of a nanodiamond or near the surface of a bulk diamond resulting from the substitution of a nitrogen atom for a carbon atom in the crystal lattice and creating a neighboring void in the lattice.

The following describes investigations that demonstrated the ability to control the electron spin of nanodiamonds while levitated in a vacuum, which at least in part led to the present invention. The term "vacuum" will be used herein to refer to pressures below atmospheric pressure (760 torr), and preferably above 1 torr to less than 760 torr. Particular investigations evidenced that different gases have different effects on the photoluminescence signal and electron spin resonance (ESR) signal of nitrogen-vacancy (NV) centers of nanodiamonds.

Figure 1:
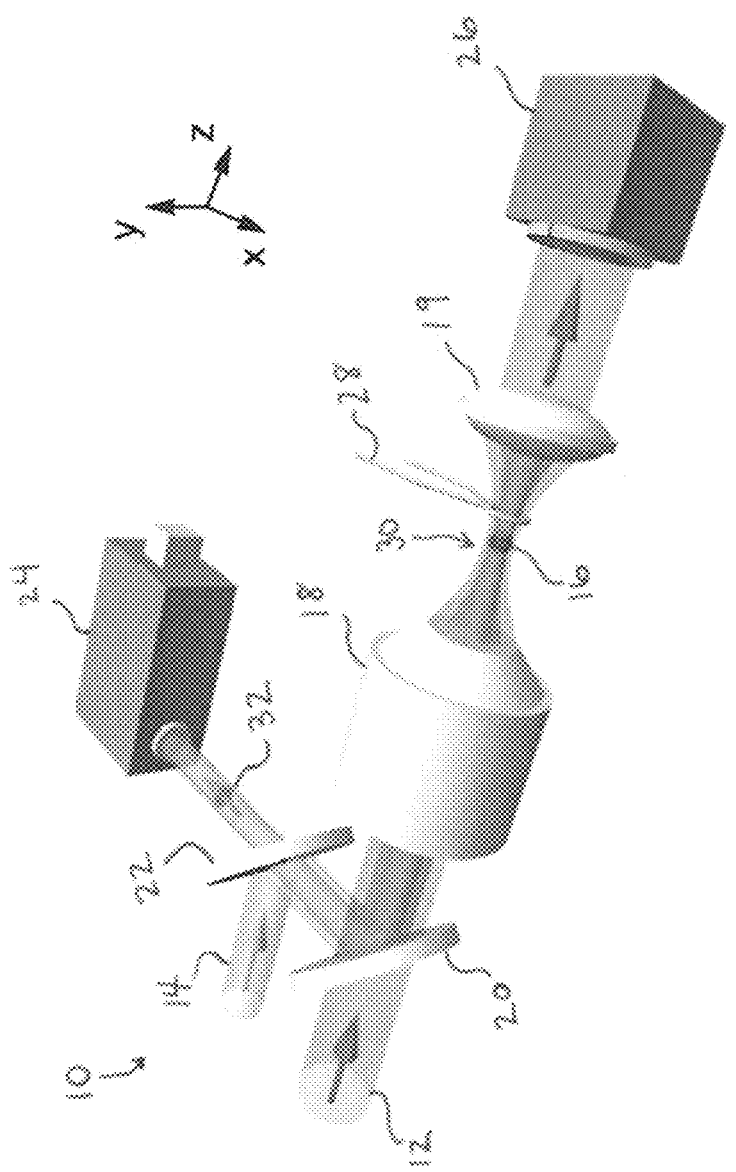
FIG. 1 schematically represents a nanodiamond (sphere) trapped inside a vacuum chamber using optical tweezers formed by a 1550 nm laser and an objective lens. A position detector monitors the nanodiamond's center-of-mass motion. Nitrogen vacancy (NV) centers are optically excited by a 532 nm laser guided by a beam splitter and a long-pass dichroic mirror. A fluorescent signal of the NV centers is detected by a spectrometer with an electron multiplying charge-coupled device (EMCCD) camera. Electron spins are controlled by microwaves delivered by an antenna. Arrows illustrate the directions of light beams.
Figure 3:
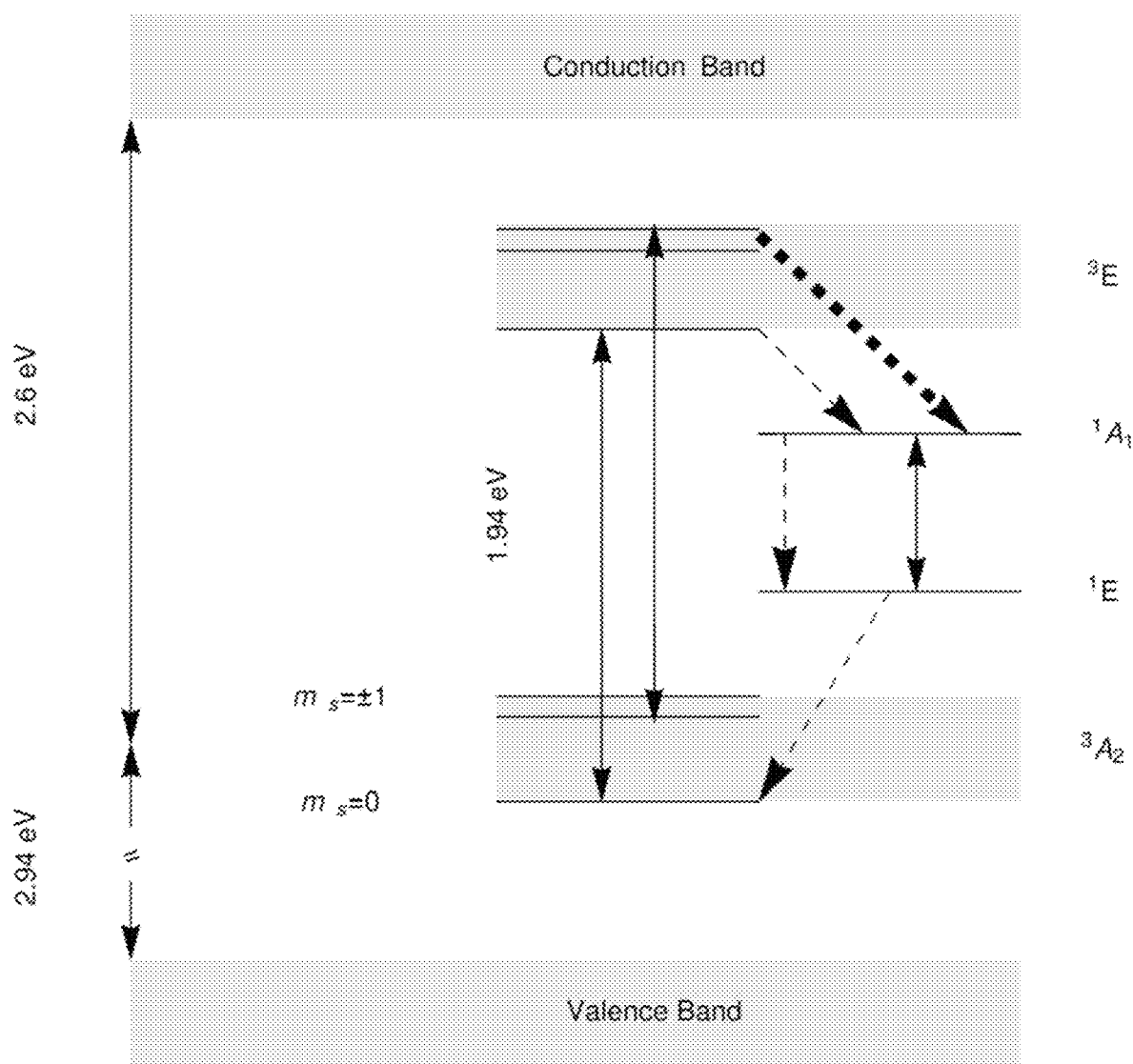
FIG. 3 schematically represents a molecular structure of an NV center in the nanodiamond represented in FIG. 1. Carbon atoms are labeled "C," a lattice vacancy is labeled "V," and a nitrogen atom is labeled as "N." The nanodiamond is estimated to have about 500 NV centers.

FIG. 1 schematically represents a levitated spin-optomechanical system 10 utilized in the investigations. The system 10 included a vacuum chamber 30 using optical tweezers formed by directing a first laser beam 12 (e.g., 1550 nm; 500 mW) through an infrared objective lens 18 (e.g., aperture=0.85), which in combination were configured to trap and levitate one or more nanodiamonds 16 containing NV centers (FIG. 3) within the vacuum chamber 30. A position detector 26 monitored the center-of-mass motion of the nanodiamond 16. During operation, the nanodiamond 16 was optically excited by a second laser beam 14 (e.g., 532 nm) guided by a beam splitter 22 and a long-pass dichroic mirror 20 (e.g., 950 nm). A fluorescent signal 32 of the NV centers of the nanodiamond 16 was detected by a spectrometer 24 with an electron multiplying charge-coupled device (EMCCD) camera. Applying a microwave pulse to NV centers switched the direction of its electron spin. Therefore, electron spins were controlled by microwaves delivered by a millimeter-scale antenna 28 (e.g., located at a distance of about 0.5 mm from the nanodiamond 16). Arrows represent the directions of the laser beams 12 and 14 and the fluorescent signal 32.

In the investigations, optically trapping of nanodiamonds 16 inside the vacuum chamber 30 involved the use of an ultrasonic nebulizer to launch into the trapping region a mixture of commercial nanodiamonds 16 suspended in water microdroplets. The nanodiamonds 16 used in the investigations were about 100 nanometers in diameter and contained NV centers. The water microdroplets evaporated and at least one nanodiamond 16 was captured by the tightly-focused laser beam 12 after a few minutes. After the nanodiamond 16 was captured, air in the chamber was evacuated by a turbomolecular pump (not shown). The investigations were performed in a vacuum to reduce interference from air molecules.

Figure 4:
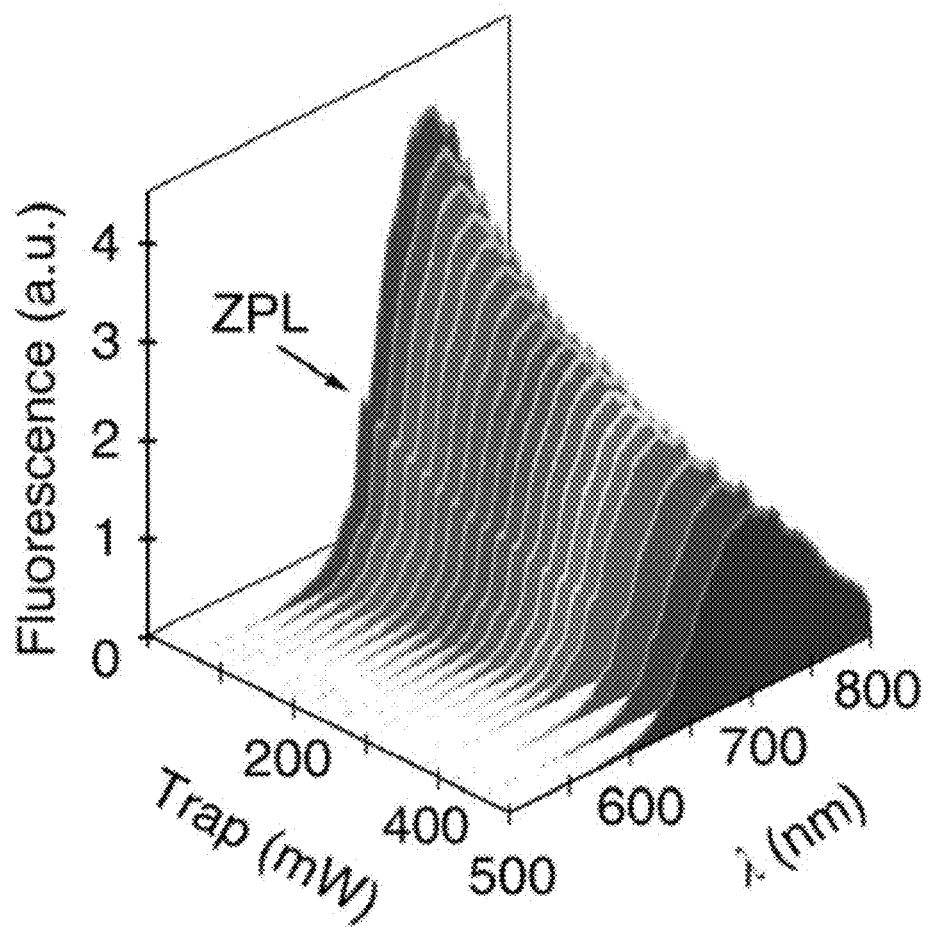
FIGS. 4-6 contain graphs evidencing effects of optical trapping power.
Figure 5:
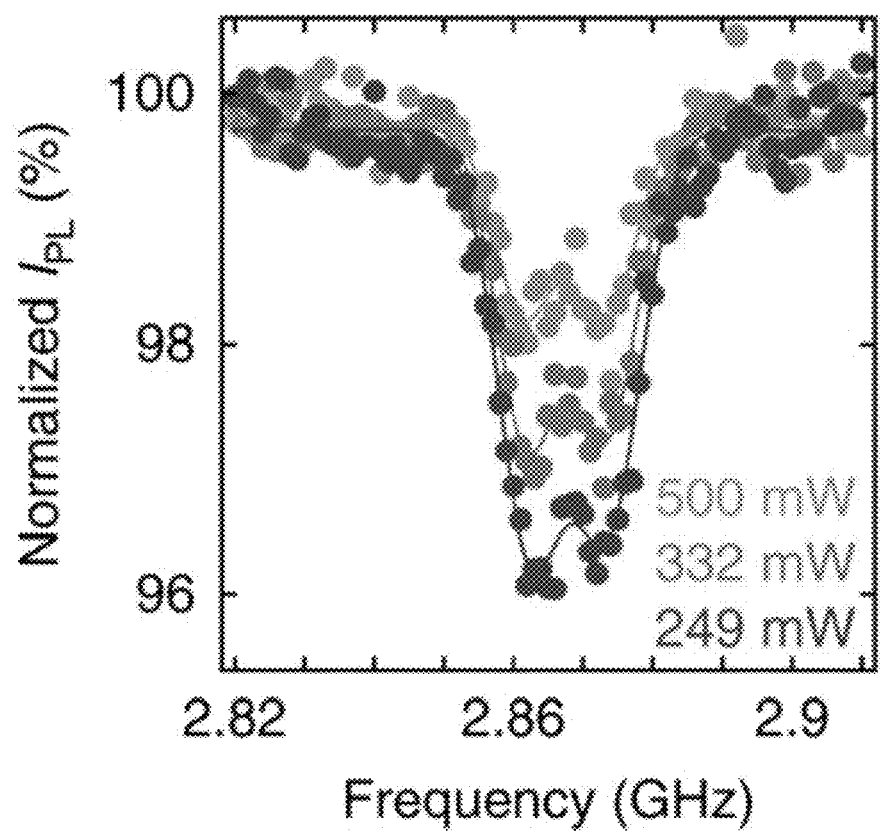

The trapped nanodiamond 16 was excited with the second laser beam 14 and the resulting fluorescent signal 32 was collected by the spectrometer 24 with the EMCCD camera with a single-photon sensitivity. To study the ESR, the electron spin states were excited by microwave radiation delivered by the coplanar waveguide antenna 28. The ESR investigations were conducted using an optically detected magnetic resonance technique. To obtain the ESR signal, the electron spin states were excited $|m_s=0\rangle \leftrightarrow |m_s=\pm 1\rangle$ by microwave pulses. For a given frequency, the antenna delivered a sequence of 500 ms alternative on/off microwave pulses to control the electron spin of the NV centers. When the microwave pulse was on, the NV ground spin state $|m_s=0\rangle$ was excited to $|ms=\pm 1\rangle$, and vice versa. At the same time, the visible fluorescence spectrum of the diamond was acquired using the spectrometer 24. Since the visible fluorescence signal of $|ms=\pm 1\rangle$ is weaker than the $|m_s=0\rangle$ state, there was a dip in the plot of the normalized $I_{PL}$ when ESR occurred. The normalized fluorescence signal $I_{PL}$ is the ratio of total fluorescence counts with and without microwave excitation, where the resonance peaks occur at the frequencies of minimum $I_{PL}$. The ESR contrast is defined as $1-I_{PL}$. As shown in FIGS. 4 and 5, both the fluorescent signal and the ESR contrast decreased as the trapping power increased.

Figure 2:
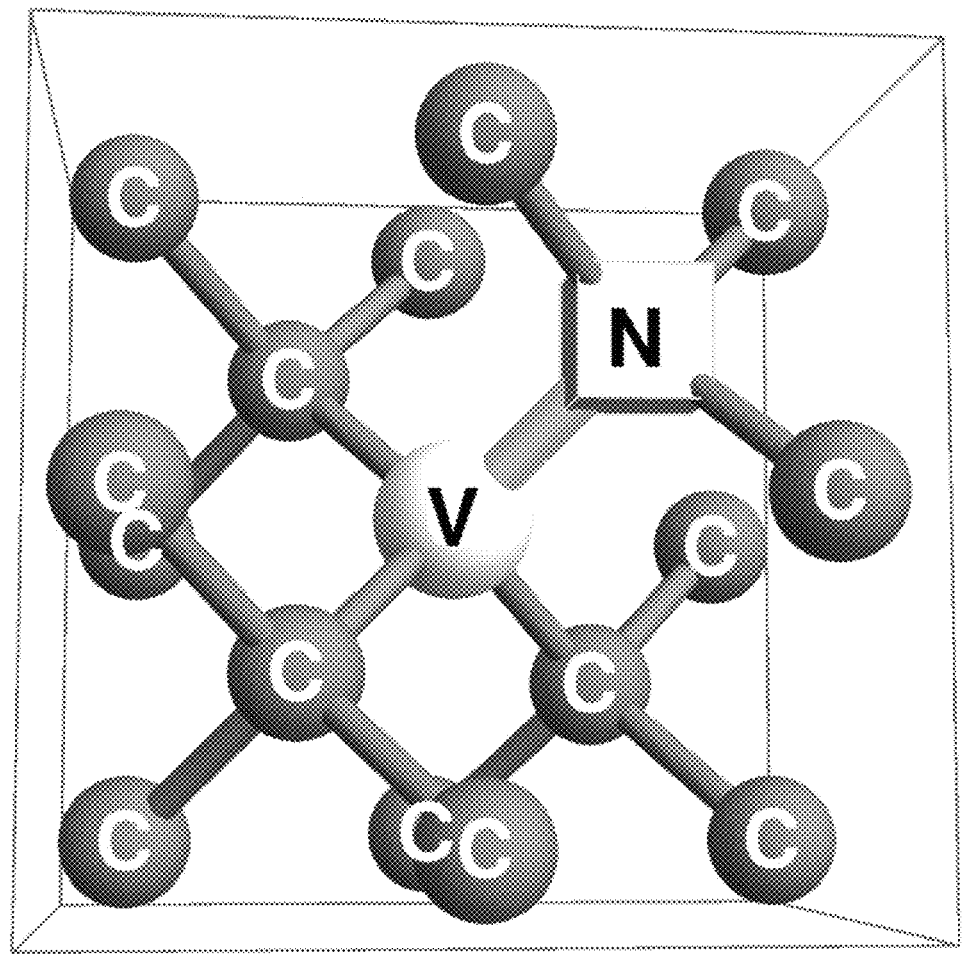
FIG. 2 schematically represents energy levels of an NV⁻ center. Solid arrows represent radiative transitions while dashed arrows represent nonradiative transitions. $^3A_2$, $^1E$, $^1A_1$, and $^3E$ denote electronic states of the NV center, and $m_s=0,\pm1$ denote the spin states of $^3A_2$.
Figure 6:
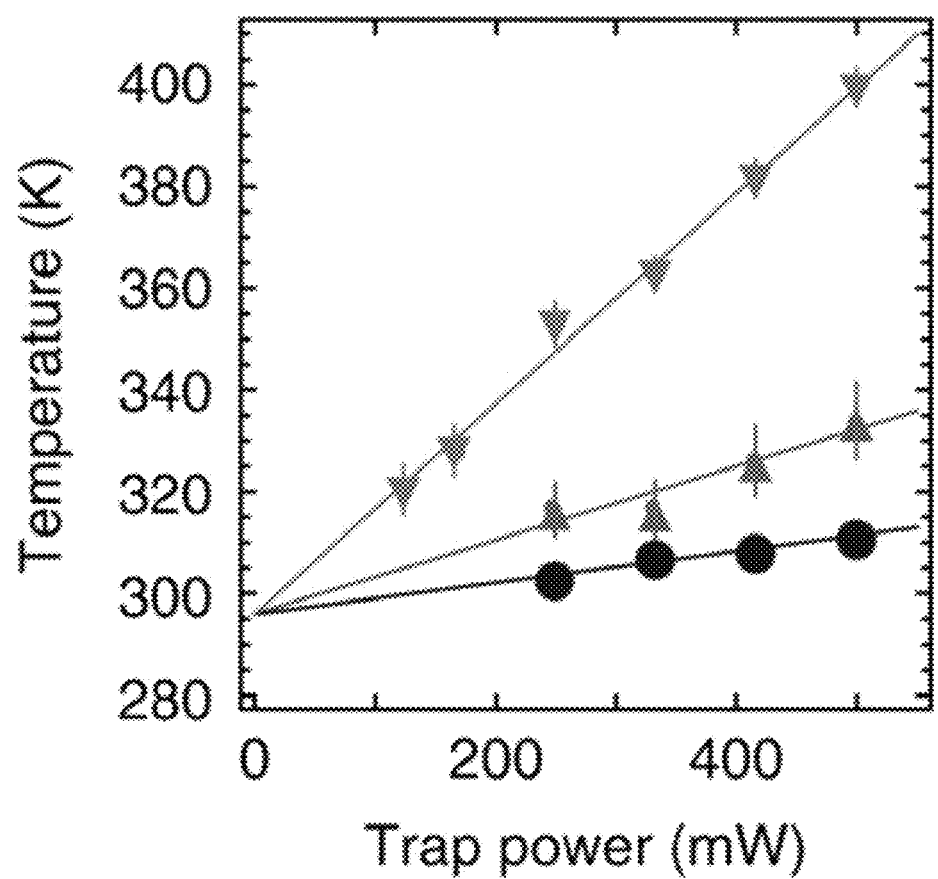

Since the absorption of the trapping laser increases temperature, a higher trapping power leads to a higher temperature of the nanodiamond (FIG. 6). The visible fluorescent signal comes from the radiative decay transition $^3E \rightarrow ^3A_2$. There is also a competing process that the excited state $^3E$ may relax to the ground state $^3A_2$ through a nonradiative process with metastable states $^1E$ and $^1A_1$ (FIG. 2). Because a high temperature enhances the nonradiative decay, it weakens the visible fluorescence strength (FIG. 4).

Besides heating, the first laser beam 12 can cause photo-induced ionization of $NV^-$ to $NV^0$ when the second laser beam 14 is activated. As shown in FIG. 2, the second laser excites the NV centers from the ground state $^3A_2$ to the excited state $^3E$. Since the separation between the excited state and the conduction band is 0.67 eV (corresponding to a vacuum wavelength of 1880 nm), the first beam 12 can excite electrons from the excited state $^3E$ to the conduction band and consequently ionize $NV^-$ to $NV^0$. Because high trapping power increases the ionization rate from $NV^-$ to $NV^0$, the fluorescence signal from $NV^-$ is reduced as seen in FIG. 4. Similar effects have been observed for laser wavelengths of 1064 nm and below.

Although the first laser beam 12 was produced during the investigations at a wavelength of 1550 nm, other wavelengths may be used. However, the investigations indicated that a 1550 nm laser beam was more benign to the photoluminescence of NV centers than a 1064 nm laser beam. More than 70 percent of bare nanodiamonds trapped by a 1550 nm laser showed a strong fluorescence signal, while only a few percent of bare nanodiamonds (even though each nanodiamond contains about 500 NV centers on average) and 10 to 20 percent of silica-coated nanodiamonds trapped by a 1064 nm laser produced photoluminescence. The ionization not only reduced the fluorescence strength, but also lessened the ESR contrast. When the recombination of $NV^0$ to $NV^-$ occurs, the probability of $NV^0$ ending up in $|m_s=0\rangle$ state is ⅓. Thus the ionization due to the trapping laser reduced the overall population of $|m_s=0\rangle$ and reduced the ESR contrast. It is also foreseeable and within the scope of the invention that wavelengths other than 532 nm may be used for the second laser beam 14.

Figure 7:
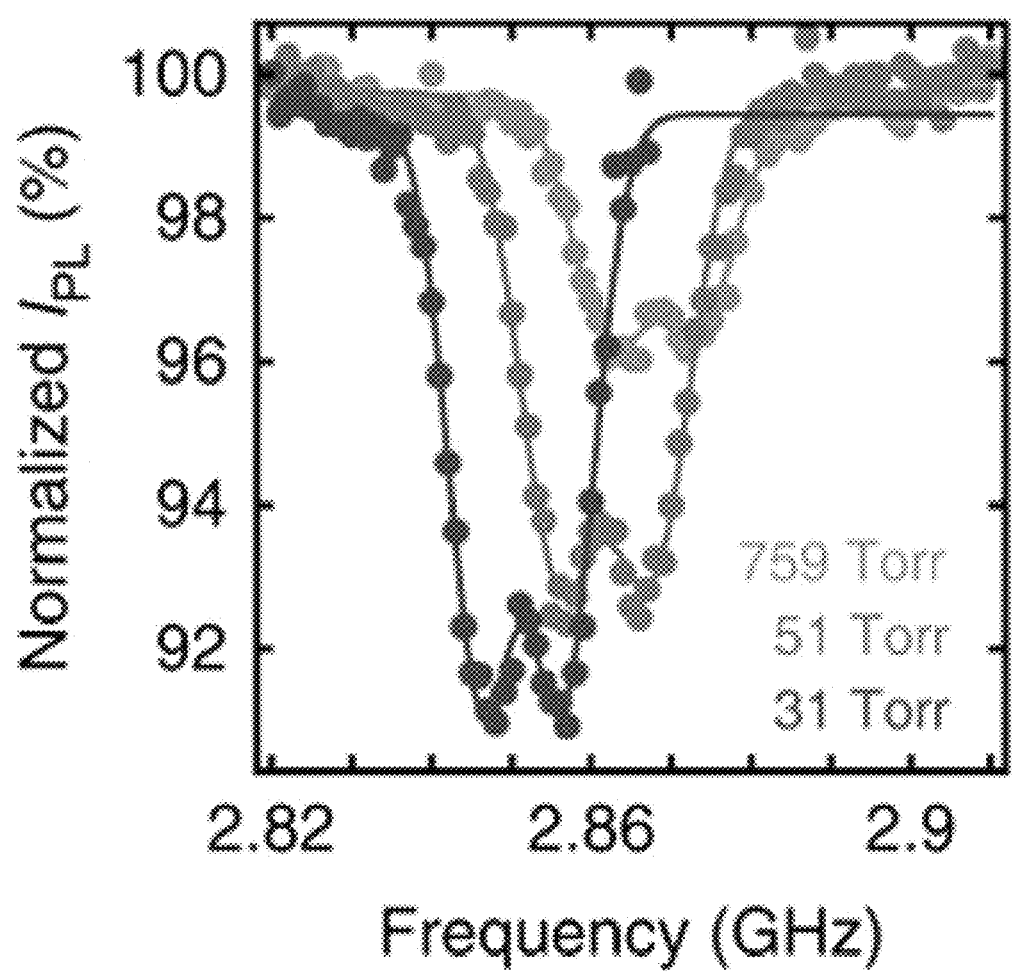
FIGS. 7-9 contain graphs plotting electron spin resonance in low vacuum.
Figure 8:
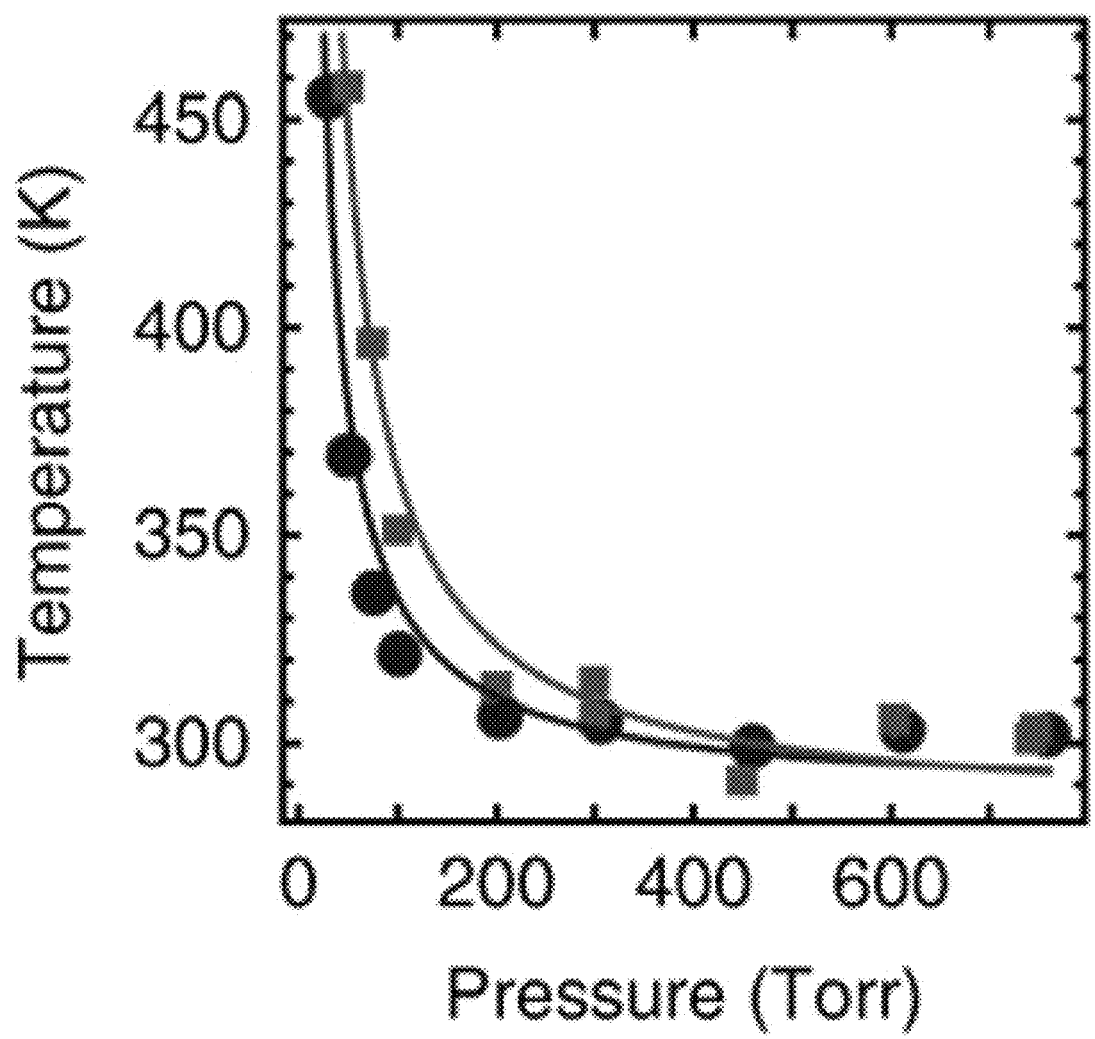
Figure 9:
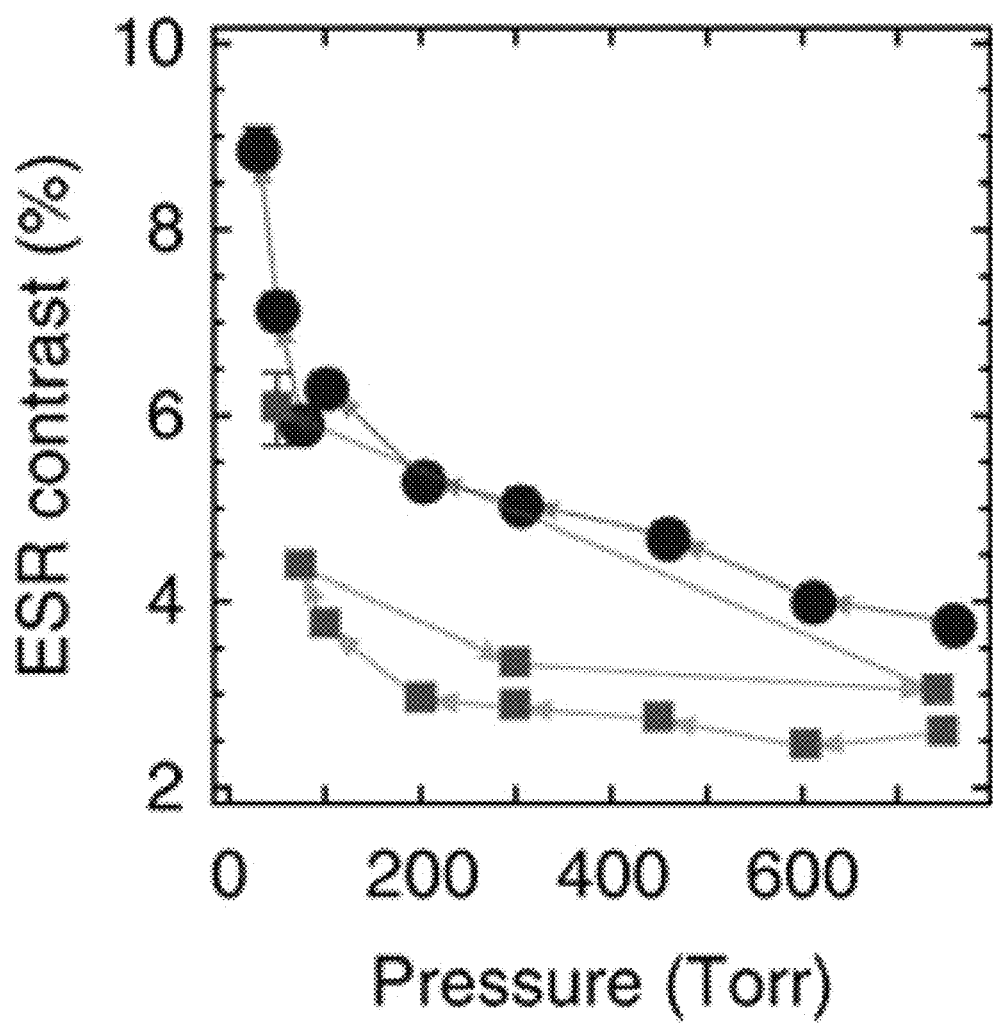

Since the nanodiamond temperature increases in vacuum, the ESR spectrum shifted to the left as shown in FIG. 7. From atmospheric pressure to 31 torr, the temperature of the nanodiamond 16 can rise from 300K to above 450K (FIG. 8). When the mean free path of gas molecules is larger than the size of the nanodiamond 16, the cooling due to the surrounding gas is proportional to the pressure. So the increase of the temperature of the nanodiamond 16 was inversely proportional to the pressure: $\Delta T \propto 1/P_{gas}$, as shown by the solid curves in FIG. 8. As the temperature rises in vacuum, one would expect the ESR contrast to decrease. Counter intuitively, the data showed that the ESR contrasts of levitated nanodiamonds increased by more than a factor of two when the pressure was decreased from atmospheric pressure to 31 torr (FIGS. 7 and 9).

To verify that the increase in ESR contrast is a reversible process instead of a permanent change of the nanodiamond 16, an investigation was performed in which the chamber 30 was first pumped from atmospheric pressure to 74 torr, and then brought back to atmospheric pressure. The contrast at the later atmospheric pressure was slightly higher than the initial atmospheric pressure (square markers in FIG. 9), but significantly smaller than the ESR contrast at low pressure. The slight increase of the ESR contrast at the later atmospheric pressure can be explained by the purification of the nanodiamond 16 after exposure to vacuum. However, the main change of the ESR contrast was reversible. If the nanodiamond 16 was permanently changed, one would expect the nanodiamond 16 to maintain a high ESR contrast when the pressure was brought back to atmospheric level from 74 torr, which is opposite to the measured data. Therefore, the reduction of surrounding and absorbed air molecules was concluded to be the primary source of the ESR enhancement.

To further understand the effects of the surrounding gas on levitated nanodiamond NV centers, the surrounding gas was changed between oxygen and helium repeatedly while a nanodiamond 16 was levitated continuously for many hours. As shown in FIGS. 10-13, a first data set (labeled no. 1) was recorded in oxygen. The gas in the chamber was then changed to helium and a second data set (labeled no. 2) was recorded. And finally, the gas was changed back to oxygen and a final data set (labeled no. 3) was recorded. The gas in the chamber (helium or oxygen) had a purity greater than 99 percent, achieved by repeatedly evacuating and filling the chamber several times with a desired gas. The oxygen data sets labeled no. 1 and 3 were essentially the same (FIGS. 10-13), showing the observed effects were reversible and the temporal drift of the system 10 over several hours was negligible.

Figure 10:
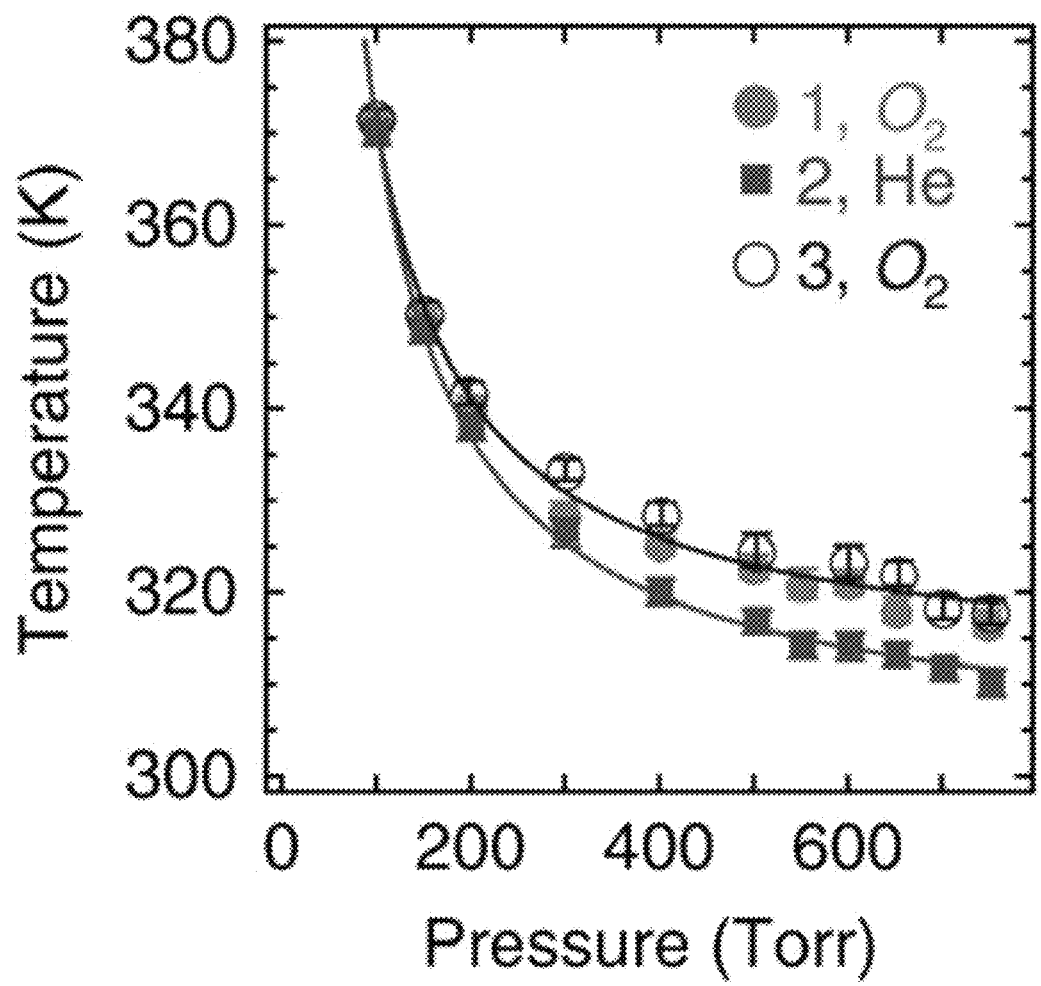
FIGS. 10-13 contain graphs plotting electron spin resonance in different gases.
Figure 11:
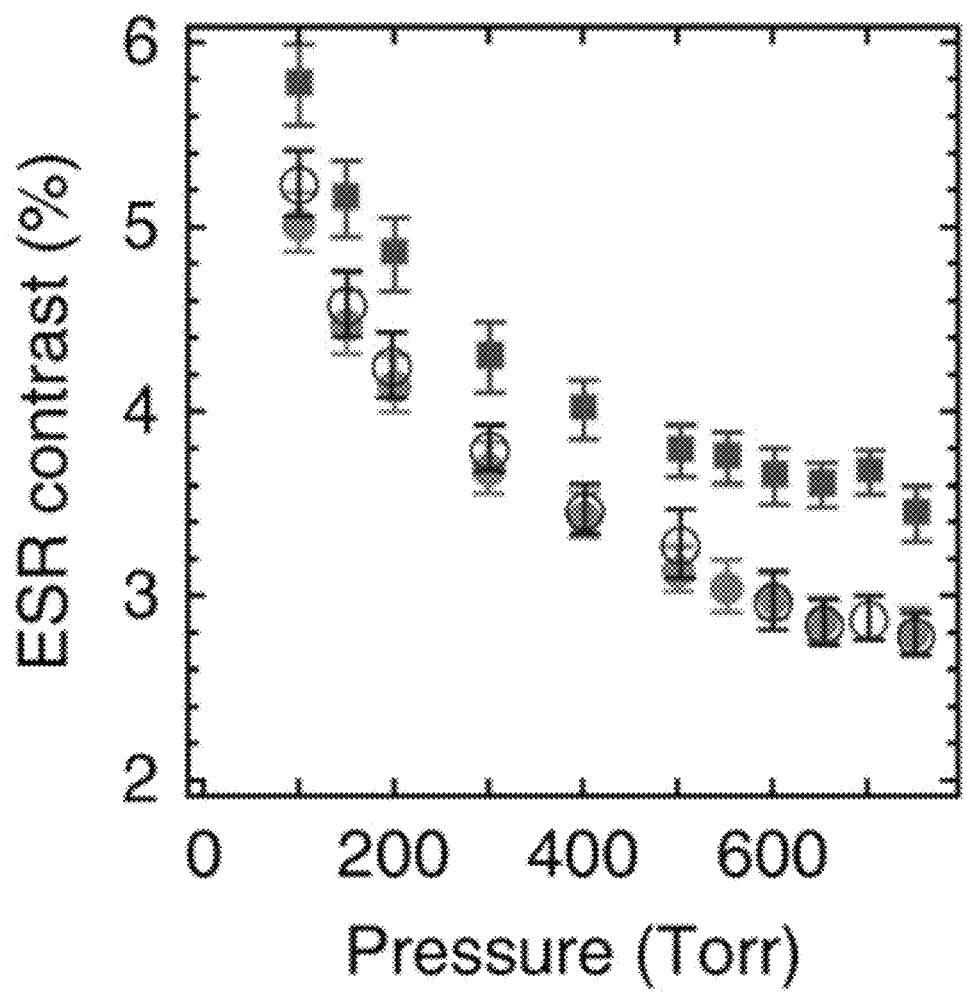
Figure 12:
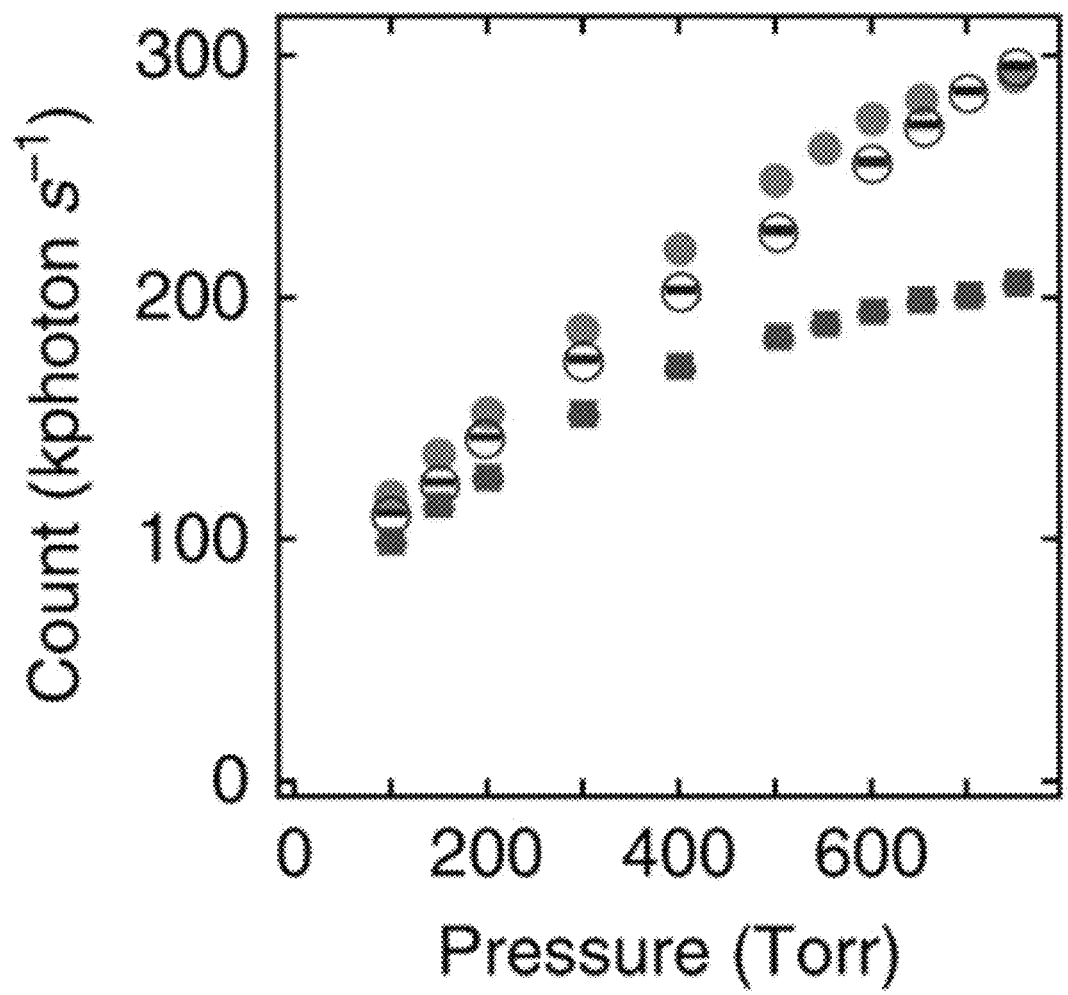
Figure 13:
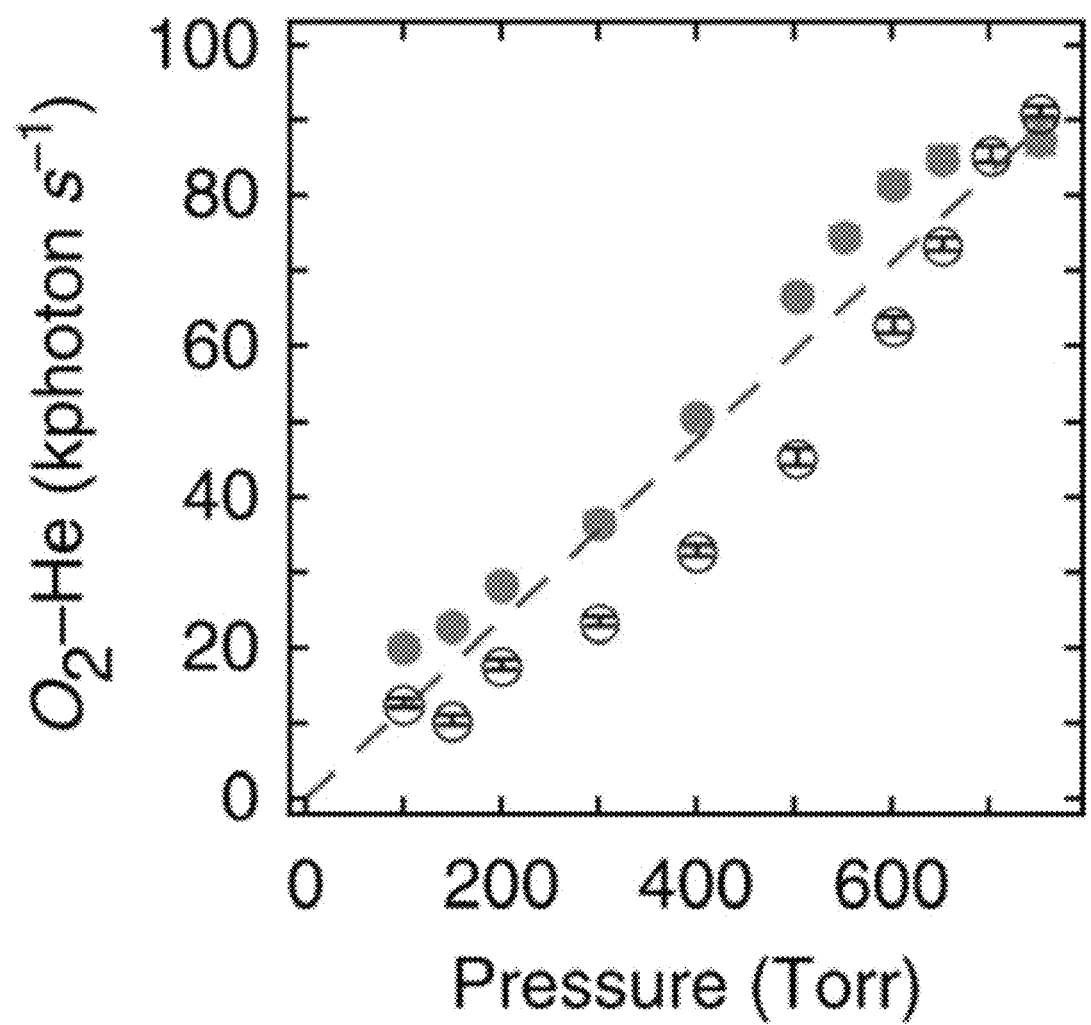
Figure 14:
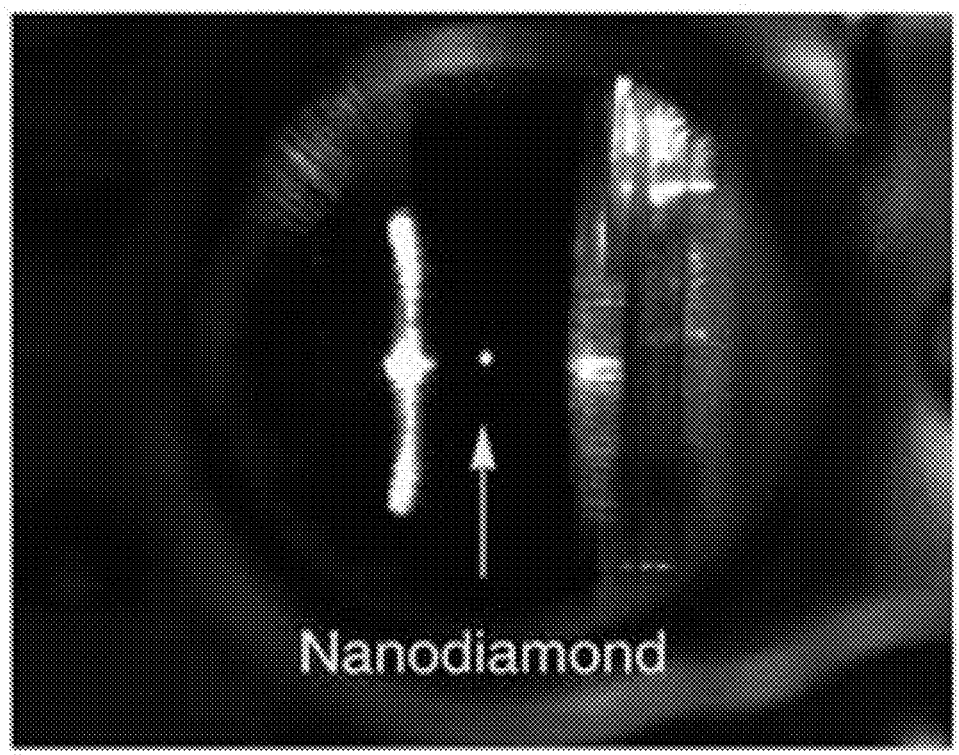
FIG. 14 is an image of a nanodiamond (bright white spot) optically levitated in a low vacuum inside a vacuum chamber.
Figure 15:
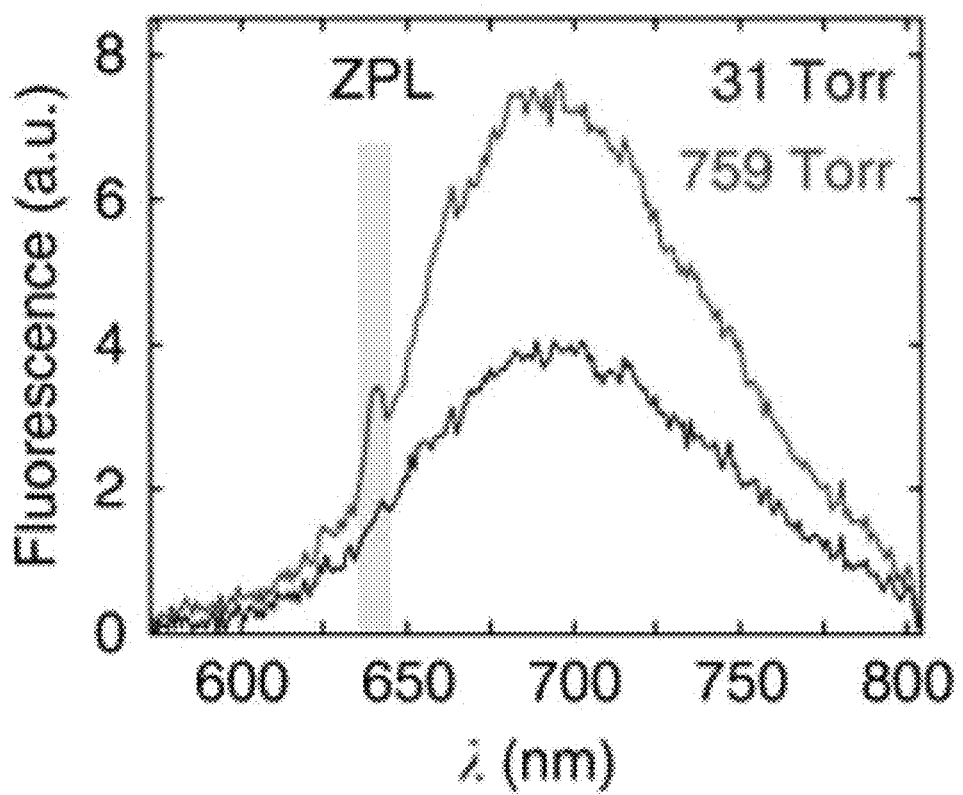
FIGS. 15 through 19 contain graphs plotting data obtained with the levitated nanodiamond of FIG. 14.
Figure 16:
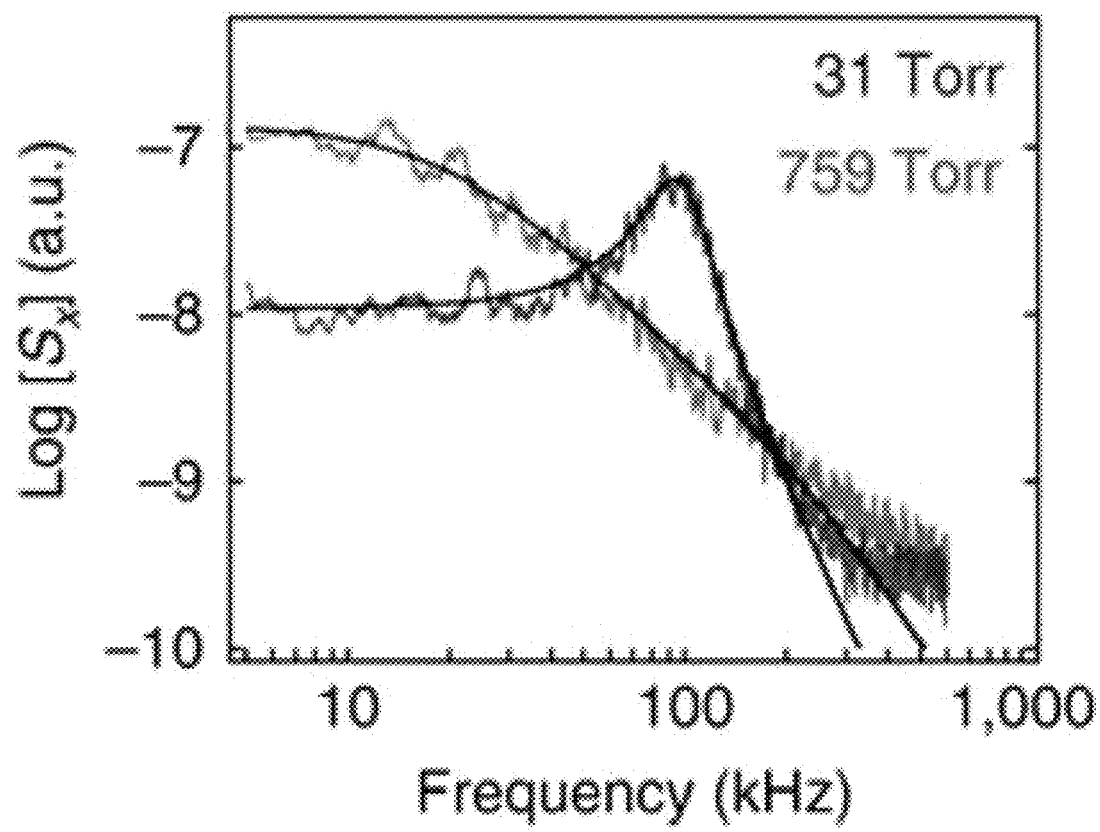
Figure 17:
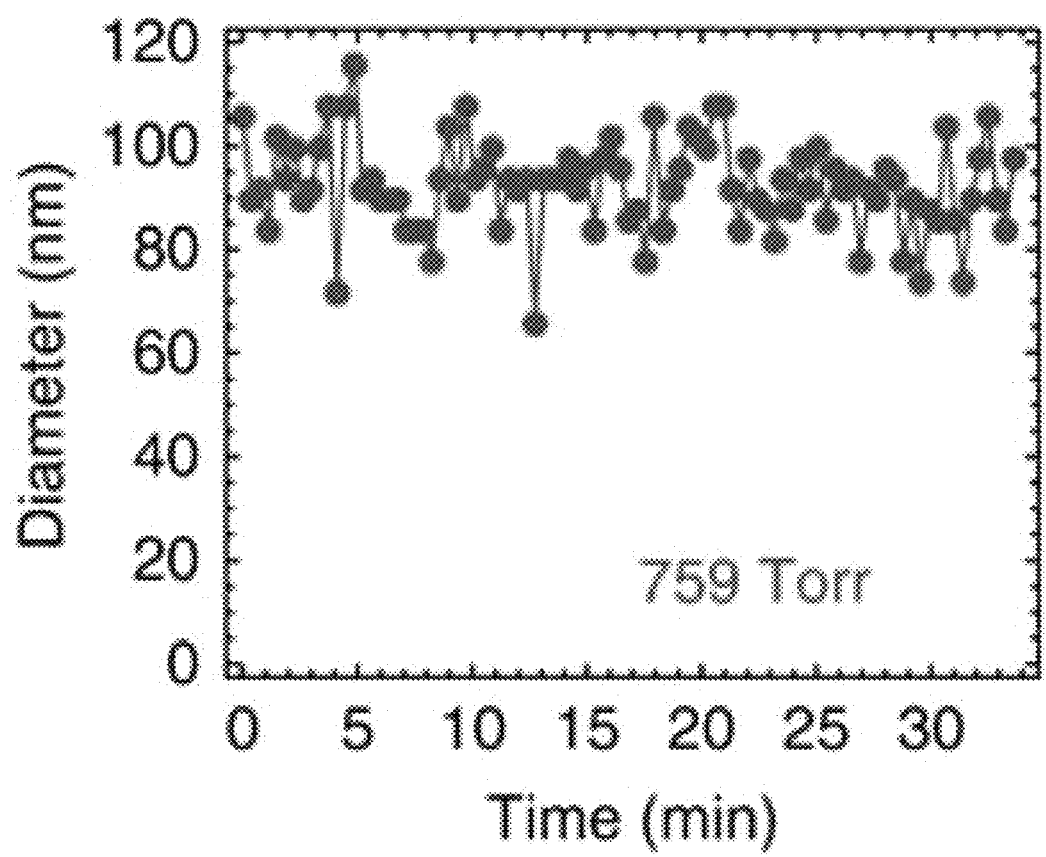
Figure 18:
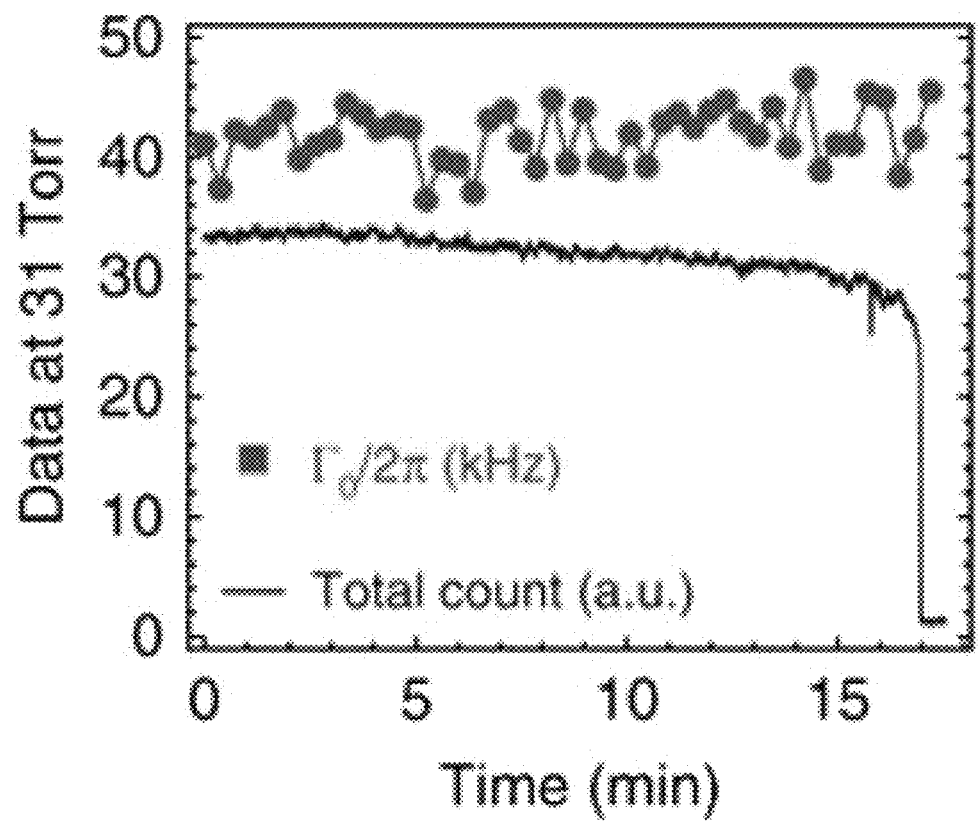
Figure 19:
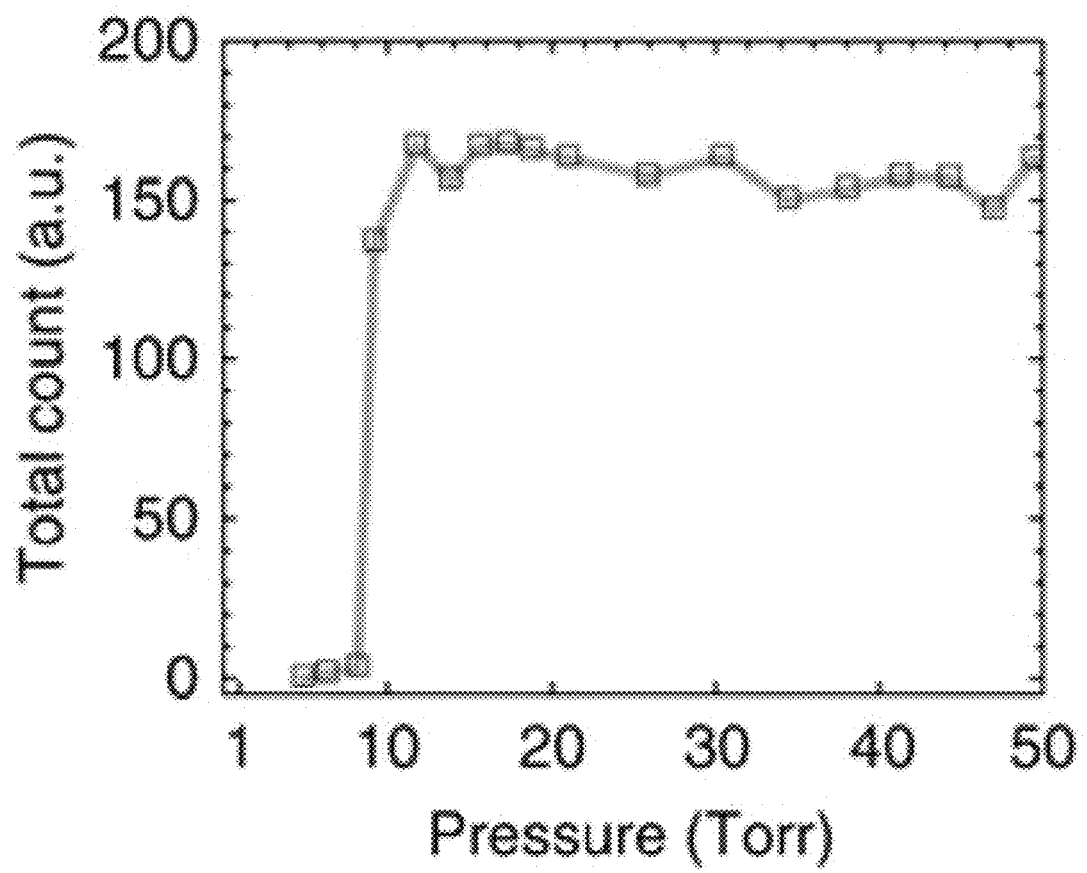

The results of these investigations demonstrated that oxygen and helium gases have different effects on both the ESR contrast and the fluorescence strength of levitated nanodiamond NV centers (FIGS. 10-13). The ESR contrast of nanodiamond NV centers in helium was about 25 percent higher than that in oxygen (FIG. 11), while the fluorescence strength in helium was about 30 percent lower than that in oxygen near atmospheric pressure (FIG. 12). When the pressure decreased, the ESR contrast increased while the fluorescence signal decreased in both helium and oxygen. The different effects of oxygen and helium on the ESR contrast and fluorescence could not be explained by their temperature difference, for example, the fluorescence strength in helium was lower than that in oxygen even though the temperature in helium was lower (the thermal conductivity of helium is higher). In general, the fluorescence strength would be expected to increase when the temperature decreases (FIGS. 10 and 12).

The observed phenomena in FIGS. 10-13 could be explained by the reduction of low-quality negatively charged NV$^-$ centers near the surface due to the reduction of oxygen surface termination, and a moderate increase of the temperature that quenches low-quality surface NV$^-$ centers without significantly affecting high-quality NV$^-$ centers at the center of the nanodiamond 16. Compared to NV centers remote from the surface, NV centers near the surface have stronger non-radioactive decays, and thus a lower ESR contrast and stronger temperature dependence. It has been observed that the fluorescence of NV centers in 20 to 30 nm diameter nanodiamonds decreased by 10 to 40 percent when the temperature was increased from 300K to 400K, accompanied by a decrease of the lifetime of the excited state due to non-radioactive decay. In contrast, the fluorescence of an NV center inside a bulk diamond only decreases by a few percent when the temperature is increased from 300K to 450K. In these investigations, the trapped nanodiamond 16 had about 500 NV centers and a diameter of about 100 nm. When the pressure decreases, the fluorescence of low-quality surface NV centers is suppressed at an increased temperature (FIG. 12). To roughly estimate the thickness of the surface shell where the fluorescence of NV centers is quenched, it can be assumed that NV centers are uniformly distributed in the nanodiamond and the fluorescence signal $C_{inner}$ of a levitated nanodiamond 16 in low vacuum comes from NV centers within the inner core of radius $r_{inner}$. The $r_{inner}$ can be estimated by comparing $C_{inner}$ to the fluorescence count $C_{atm}$ at atmospheric pressure: $C_{inner}/C_{atm} \approx r_{inner}^3/r^3$, where r is the radius of the nanodiamond 16. So $r-r_{inner}$ is approximately the thickness of the surface shell. The thickness of the surface shell was estimated to be about 10 to 15 nm for the levitated nanodiamond 16 at 100 torr (FIG. 12). Because the high-quality NV centers at the center of the 100 nm nanodiamond 16 are largely unaffected by the temperature increase while the low-quality NV centers near the surface are quenched, the overall ESR contrast increased due to the average effect of 500 NV centers (high-quality and low-quality) as shown in FIG. 11.

Moreover, a large fraction of NV centers in a nanodiamond are in NV$^0$ charge state, which have a low fluorescence signal and no ESR near 2.8 GHz. The oxygen termination allows more NV centers in NV$^-$ charge state. Thus the fluorescence strength increases when the levitated nanodiamond 16 is surrounded by oxygen (FIG. 12). However, the NV$^-$ centers enabled by oxygen termination are near the surface and have low contrast. Therefore, the ESR contrast decreased in oxygen, as shown in FIG. 11.

While oxygen has been used for permanent surface termination, here it was shown that this can also happen in air near room temperature and is reversible. Because the effects are reversible, nanodiamond NV centers can be used for oxygen gas sensing repeatedly. Using the fluorescence signal in helium gases as the background correction for the thermal effect, the count difference in oxygen and helium gases exhibits roughly linear dependence on the pressure. Although the total fluorescence counts (FIG. 12) showed a nonlinear scaling, the difference between the counts in oxygen and helium gases (FIG. 13) trends to be proportional to the pressure in the range of the data. As a first order approximation, the data was fit with a line (dashed line in FIG. 13). The un-optimized imaging setup used during the investigations could detect about 100 photon torr$^{-1}$ s$^{-1}$. When the oxygen pressure is very large, it is expected that the signal would deviate from the linear fit because the maximum signal is limited by the number of NV centers in the nanodiamond 16.

During the investigations, the system 10 was used to continuously flip the electron spin in a nanodiamond 16 levitated in a vacuum and in the presence of different gases. Certain investigations showed that oxygen and helium gases had different effects on the photoluminescence and the ESR contrast of nanodiamond NV centers. It was also observed that the strength of electron spin resonance was enhanced as pressure was reduced. To further evaluate the technique, the investigations explored the effects of trap power and measured the absolute internal temperature of levitated nanodiamonds with ESR after calibration of the strain effect.

On the basis of the investigations, it was concluded that NV centers in a nanodiamond or near the surface of a bulk diamond can be used to acquire physical and quantum information, nonlimiting examples of which include applications in sensors, quantum information processing, and studies into the fundamental physics of quantum mechanics. Although NV centers reside beneath the surface of the diamond (e.g., a few nm or more), the NV centers can interact with surrounding gases through various different channels. As the gases bond to the diamond surface, the chemical bond can change the charged states of the NV centers. These surface-bonding then affect the fluorescence strength of the NV centers. Moreover, the electron spin of NV centers can interact with the induced magnetic field due to the magnetic moment of the gas. The induced magnetic field can cause spin relaxation in the NV centers, which is reflected to the fluorescence signal strength and the maximum contrast of the electron spin resonance signal of the NV centers. Also, each type of gas with its own thermal conductivity can have different thermal effects on the NV centers.

As particular examples, the results of the investigations suggested that the technique could be used in a sensor to detect and/or measure gases, for example, to monitor the oxygen concentration in automotive exhaust and in medical instruments, such as anesthesia monitors and respirators, and could find uses in quantum information processing, experimental techniques to probe fundamental physics in quantum mechanics, and the measurement of magnetic and gravitational fields, which could be applied to, as nonlimiting examples, computer memory and experiments to search for deviations from Newton's law of gravitation.

Figure 20:
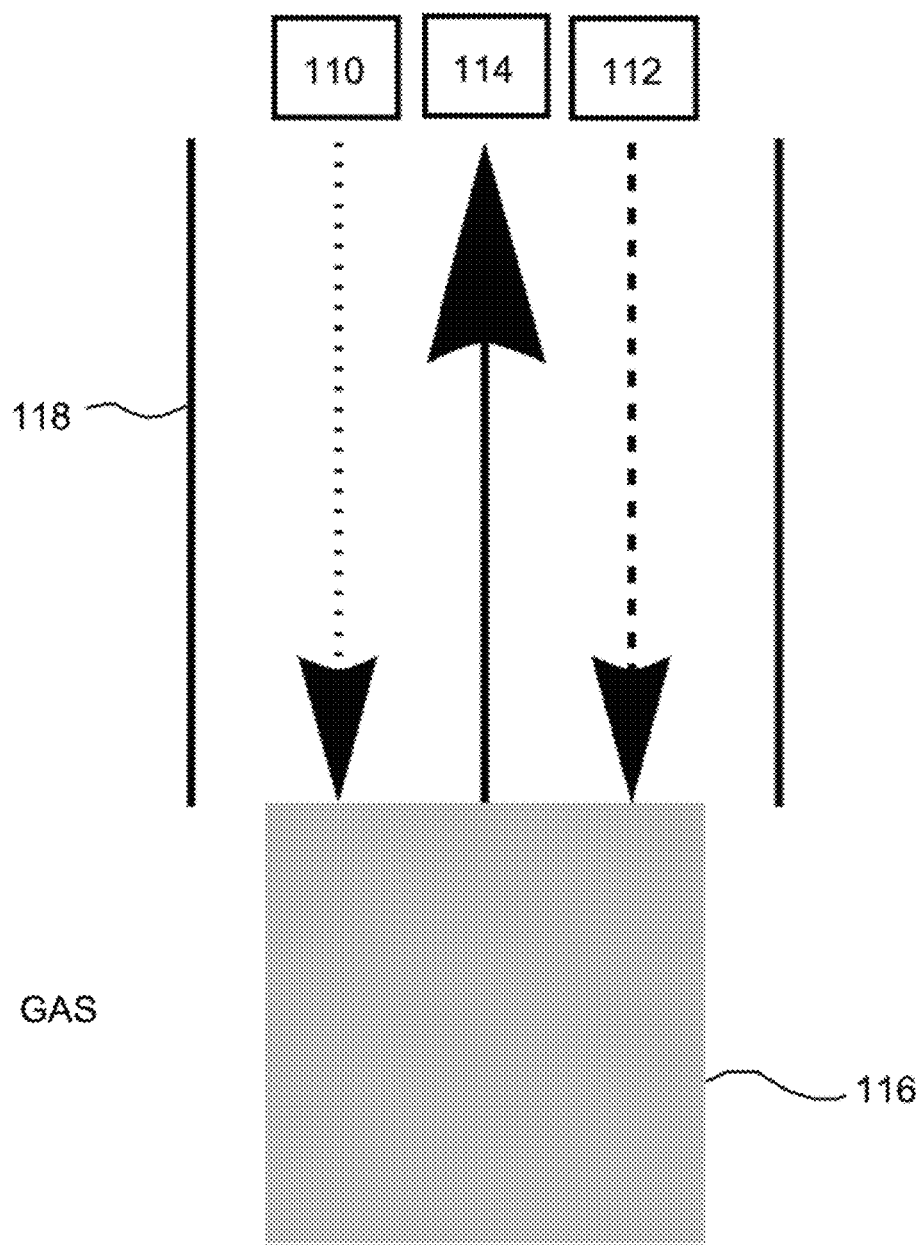
FIG. 20 schematically represents components of a nonlimiting gas sensor in accordance with certain aspects of the present invention.

FIG. 20 schematically represents components of a nonlimiting embodiment of a gas sensor. The sensor preferably is capable of detecting a type of gas in an environment and measuring the gas concentration, although it is foreseeable that a particular sensor could be limited to one of these capabilities or have additional capabilities. The gas sensor includes at least a nanodiamond 116, an optical light source 110, a microwave source 112, and a detector 114.

While the gas sensor is exposed to a surrounding gas, an optical light beam (e.g., laser beam) is applied to excite the NV centers in the nanodiamond 116. The interaction between the NV centers and the surrounding gas determines the strength of fluorescence signal emitted from NV centers. The fluorescence signal is collected by the detector 114 and used to extract information about the gas type and the gas concentration. For example, an NV center exposed in oxygen gas will have a stronger fluorescence signal than that exposed in helium gas (FIG. 12), and higher level of oxygen yields stronger fluorescence signal strength (FIG. 13) relative to helium. Therefore, the gas sensor use the detected fluorescence signal to a determine the presence and concentration of a specific gas in the surrounding gas.

In addition to or as an alternative to analyzing the fluorescence signal alone, the gas sensor may obtain information about the gas type and gas concentration through an electron spin resonance (ESR) signal. This may be accomplished by applying microwave radiation with the microwave source 112 through a waveguide 118 to excite the spin states of NV centers in the nanodiamond 116. The detector 114 or a second detector (not shown) collects the ESR signal and, for example, maximum contrast values of each ESR spectrum can be used to determine the gas type and gas concentration. For example, the maximum contrast values of ESR are different for oxygen and helium gases (FIG. 11). It is foreseeable and within the scope of the invention that the gas sensor may omit the microwave source 112, and instead rely only on the fluorescence signal rather than the ESR signal or both the fluorescence and ESR signals. However, it is believed that detecting and analyzing both the fluorescence and ESR signals will improve accuracy in identifying and measuring the concentration of a gas.

Gas concentration sensors that utilize techniques disclosed herein may have active components having sizes as small as a few nanometers, though may be larger, for example, a few centimeters. In addition, the operation of such a sensor does not require the consumption of the gas being sensed. Because diamond is very stable, a nanodiamond gas concentration sensor should be capable of exhibiting a long life and be operable over a large range of working temperature, for example, from absolute zero (0K) to temperatures of up to about 800K.

In addition, such sensors do not require the nanodiamonds to be levitated. Instead, gas sensing may be accomplished with systems, for example, simply having nanodiamonds on a substrate. A plurality of nanodiamonds can be used to improve the sensitivity of gas sensors, including those used to monitor oxygen concentrations in exhaust gases of internal combustion engines and in medical instruments such as anaesthesia monitors and respirators. As a nonlimiting example, a sensor having a surface area of 5 mm×5 mm may have thousands of nanodiamonds.

If used to study macroscopic quantum mechanics, the levitated spin-optomechanical techniques disclosed herein can be employed in quantum computers that take advantage of phenomena described by quantum theory called "superposition" and "entanglement." Computers based on quantum physics may dramatically increase the capacity to process, store and transmit information.

Additional aspects and advantages of this invention may be further appreciated from the description contained in a published paper, Thai M. Hoang, Jonghoon Ahn, Jaehoon Bang, Tongcang Li., "Electron spin control of optically levitated nanodiamonds in vacuum," Nature Communications 7, 12550 (2016) (hereinafter Hoang et al.), whose contents are incorporated herein by reference.

While the invention has been described in terms of specific or particular embodiments and investigations, it is apparent that other forms could be adopted by one skilled in the art. For example, the systems and sensors and their components could differ in appearance and construction from the embodiments described herein and shown in the drawings, functions of certain components of the system could be performed by components of different construction but capable of a similar (though not necessarily equivalent) function, process parameters could be modified, and appropriate materials could be substituted for those noted. Accordingly, it should be understood that the invention is not limited to any embodiment described herein or illustrated in the drawings, nor is the invention necessarily limited by the description, results, and/or conclusions contained in Hoang et al. It should also be understood that the phraseology and terminology employed above are for the purpose of describing the disclosed embodiments and investigations, and do not necessarily serve as limitations to the scope of the invention. Therefore, the scope of the invention is to be limited only by the following claims.

The invention claimed is:
1. A sensor comprising:
a diamond material containing a nitrogen vacancy center, the diamond material being configured to be exposed to an environment comprising one or more gases;
an optical light source configured to excite the nitrogen vacancy center of the diamond material with an optical light beam produced therefrom;
a detector configured to detect a signal originating from the diamond material in response to the optical light beam exciting the nitrogen vacancy center; and
means for analyzing the signal to identify a specific gas in the environment.

2. The sensor according to claim 1, further comprising means for analyzing the signal to measure a concentration of the specific gas in the environment.

3. The sensor according to claim 1, wherein the signal is a fluorescent signal of the nitrogen vacancy center and the detector configured for collecting the fluorescent signal.

4. The sensor according to claim 3, further comprising a microwave source configured to apply microwave radiation to the nitrogen vacancy center to excite a spin state of the nitrogen vacancy center in the diamond material, and means for detecting an electron spin resonance signal originating from the diamond material in response to excitation of the spin state of the nitrogen vacancy center, means for analyzing the electron spin resonance signal to identify a specific gas in the environment or a concentration of the specific gas.

5. The sensor according to claim 1, wherein the signal is an electron spin resonance signal and the sensor further comprises a microwave source configured to apply microwave radiation to the nitrogen vacancy center to excite a spin state of the nitrogen vacancy center in the diamond material.

6. The sensor according to claim 1, wherein the specific gas is oxygen.

7. A method of identifying a specific gas in an environment with the sensor of claim 1, the method comprising:
- exposing the diamond material containing the nitrogen vacancy center to an environment comprising one or more gases;
- exciting the nitrogen vacancy center of the diamond material with an optical light beam generated with the optical light source;
- detecting a signal originating from the diamond material in response to excitation of the nitrogen vacancy center with the detector; and
- analyzing the signal to identify the specific gas in the environment.

8. A method comprising:
- exposing a diamond material containing a nitrogen vacancy center to an environment comprising one or more gases;
- exciting the nitrogen vacancy center of the diamond material with an optical light beam;
- detecting a signal originating from the diamond material in response to excitation of the nitrogen vacancy center; and
- analyzing the signal to identify a specific gas in the environment.

9. The method according to claim 8, further comprising analyzing the signal to measure a concentration of the specific gas in the environment.

10. The method according to claim 8, wherein the signal is a fluorescent signal of the nitrogen vacancy center.

11. The method according to claim 10, further comprising:
- applying microwave radiation to the nitrogen vacancy center to excite a spin state of the nitrogen vacancy center in the diamond material;
- detecting an electron spin resonance signal originating from the diamond material in response to excitation of the spin state of the nitrogen vacancy center; and
- analyzing the electron spin resonance signal to identify the specific gas in the environment or a concentration of the specific gas.

12. The method according to claim 8, wherein the signal is an electron spin resonance signal and the method further comprises applying microwave radiation to the nitrogen vacancy center to excite a spin state of the nitrogen vacancy center in the diamond material.

13. The method according to claim 8, wherein the specific gas is oxygen.

14. A method of using a levitated spin-optomechanical system comprising:
- a laser source configured for elevating in a vacuum a diamond material containing a nitrogen vacancy center;
- a microwave source configured to apply microwave radiation to the diamond material for controlling and flipping the electron spin of the nitrogen vacancy center; and
- a detector for monitoring electron spin of the nitrogen vacancy center;

the method comprising:
- using the laser source to elevate the diamond material containing the nitrogen vacancy center in the presence of one or more gases;
- using the detector to monitor the electron spin of the nitrogen vacancy center; and
- controlling and flipping the electron spin of the nitrogen vacancy center with the microwave source;
- exciting the nitrogen vacancy center of the diamond material with an optical light beam;
- detecting a signal originating from the diamond material in response to the optical light beam exciting the nitrogen vacancy center; and
- comparing an effect of a first gas on the photoluminescence or the electron spin resonance contrast of the nitrogen vacancy center to an effect by a second gas on the photoluminescence or the electron spin resonance contrast of the nitrogen vacancy center.

15. The method according to claim 14, wherein the diamond material is elevated in the presence of the one or more gases in a vacuum of above 1 torr to less than 760 torr.

16. The method according to claim 14, wherein the diamond material is a nanodiamond having a maximum dimension of less than one micrometer.

* * * * *